(12) United States Patent
Ohmiya et al.

(10) Patent No.: US 7,602,071 B2
(45) Date of Patent: Oct. 13, 2009

(54) APPARATUS FOR DIVIDING AN ADHESIVE FILM MOUNTED ON A WAFER

(75) Inventors: Naoki Ohmiya, Tokyo (JP); Kentaro Iizuka, Tokyo (JP); Yusuke Nagai, Tokyo (JP)

(73) Assignee: Disco Corporation, Tokyo (JP)

( * ) Notice: Subject to any disclaimer, the term of this patent is extended or adjusted under 35 U.S.C. 154(b) by 266 days.

(21) Appl. No.: 11/190,966

(22) Filed: Jul. 28, 2005

(65) Prior Publication Data
US 2006/0030129 A1 Feb. 9, 2006

(30) Foreign Application Priority Data
Aug. 5, 2004 (JP) .............................. 2004-228809

(51) Int. Cl.
*H01L 23/28* (2006.01)
(52) U.S. Cl. ............... 257/787; 257/620; 257/E23.078; 156/349
(58) Field of Classification Search ................ 156/349; 257/787, 620, E23.078
See application file for complete search history.

(56) References Cited
U.S. PATENT DOCUMENTS

| | | | |
|---|---|---|---|
| 6,638,865 B2 | 10/2003 | Tanaka | |
| 6,756,562 B1 | 6/2004 | Kurosawa et al. | |
| 2002/0173069 A1* | 11/2002 | Shibata | 438/106 |
| 2004/0104491 A1* | 6/2004 | Connell et al. | 257/787 |
| 2005/0023260 A1* | 2/2005 | Takyu et al. | 219/121.67 |
| 2005/0196941 A1* | 9/2005 | Park et al. | 438/462 |

FOREIGN PATENT DOCUMENTS

| | | |
|---|---|---|
| CN | 1348208 A | 5/2002 |
| JP | 9167779 | 6/1997 |
| JP | 2000-182995 | 6/2000 |
| JP | 2002-118081 | 4/2002 |
| JP | 3408805 | 3/2003 |

* cited by examiner

*Primary Examiner*—Thanh Nguyen
(74) *Attorney, Agent, or Firm*—Smith, Gambrell & Russell, LLP

(57) ABSTRACT

A method of dividing an adhesive film mounted on the back surface of a wafer having a plurality of streets formed on the front surface in a lattice pattern and function elements formed in a plurality of areas sectioned by the plurality of streets, along the streets in a state where the wafer is put on the surface of a protective tape mounted on an annular frame, wherein the adhesive film is cooled and the protective tape is expanded to divide the adhesive film along the peripheries of the function elements.

4 Claims, 6 Drawing Sheets

(a)

(b)

(a)

(b)

APPARATUS FOR DIVIDING AN ADHESIVE FILM MOUNTED ON A WAFER

FIELD OF THE INVENTION

The present invention relates to a method and apparatus for dividing an adhesive film for die bonding, mounted on the back surface of a wafer that has a plurality of streets formed on the front surface in a lattice pattern and has function elements formed in a plurality of areas sectioned by the plurality of streets.

DESCRIPTION OF THE PRIOR ART

In the production process of a semiconductor device, for example, individual semiconductor chips are manufactured by forming a circuit such as IC or LSI in a plurality of areas sectioned by streets (lines to be cut) formed in a lattice pattern on the front surface of a substantially disk-like semiconductor wafer and dividing the semiconductor wafer into the circuit formed are as along the streets. A cutting machine called "dicing machine" is generally used as the dividing devise for dividing a semiconductor wafer to cut the semiconductor wafer along the streets with a cutting blade having a thickness of about 20 μm. The thus divided semiconductor chips are packaged, and widely used in electric equipment such as mobile phones, personal computers and the like.

An adhesive film for die bonding called "die attach film" which has a thickness of 20 to 40 μm and is formed of an epoxy resin or the like, is mounted on the back surfaces of the above individual semiconductor chips, and the chips are bonded to a die bonding frame for supporting the semiconductor chips through this adhesive film by heating. To mount the adhesive film for die bonding onto the back surfaces of the semiconductor chips, after the adhesive film is mounted on the back surface of the semiconductor wafer and the semiconductor wafer is put on a dicing tape through this adhesive film, the semiconductor wafer is cut together with the adhesive film along the streets formed on the front surface of the semiconductor wafer with a cutting blade to obtain semiconductor chips having the adhesive film on the back surface, as disclosed by JP-A 2000-182995, for example.

According to the method disclosed by JP-A 2000-182995, however, when the adhesive film is cut together with the semiconductor wafer with the cutting blade to divide the semiconductor wafer into individual semiconductor chips, the back surfaces of the semiconductor chips may have chips or whisker-like burrs appear in the adhesive film to cause disconnection at the time of wire bonding.

Lighter and smaller electric equipment such as mobile phones and personal computers are now in growing demand and under the circumstances, thinner semiconductor chips are needed. A dividing technique so called "pre-dicing" is practically used to divide a semiconductor wafer into thinner semiconductor chips. In this pre-dicing technique, dividing grooves having a predetermined depth (corresponding to the final thickness of each semiconductor chip) are formed on the front surface of the semiconductor wafer along the streets and then, exposed to the back surface by grinding the back surface of the semiconductor wafer having the dividing grooves formed on the front surface so as to divide the semiconductor wafer into individual semiconductor chips. This technique makes it possible to process each semiconductor chip to a thickness of 50 μm or less.

To divide the semiconductor wafer into individual semiconductor chips by the pre-dicing technique, however, after the dividing grooves having a predetermined depth are formed on the front surface of the semiconductor wafer along the streets, the back surface of the semiconductor wafer is ground to expose the dividing grooves to the back surface. Therefore, the adhesive film for die bonding cannot be mounted on the back surface of the semiconductor wafer beforehand. Accordingly, to bond the semiconductor chips to a die bonding frame for supporting the semiconductor chips in the pre-dicing technique, a bonding agent must be interposed between the semiconductor chips and the die bonding frame, thereby making it impossible to carry out the bonding work smoothly.

To solve the above problem, JP-A 2002-118081 discloses a process for manufacturing a semiconductor chip by mounting an adhesive film for die bonding onto the back surface of a semiconductor wafer divided into individual semiconductor chips by the pre-dicing technique, putting the semiconductor wafer on a dicing tape through this adhesive film, and then, chemically etching portions exposed to the gaps between adjacent semiconductor chips of the adhesive film to remove it as well as a process for manufacturing a semiconductor chip by applying a laser beam to portions exposed to the gaps between adjacent semiconductor chips of the adhesive film through the gaps from the front surfaces of the semiconductor chips to remove the portions exposed to the gaps of the adhesive film.

Meanwhile, a laser processing technique for applying a laser beam capable of passing through a semiconductor wafer with its focusing point set to the inside of the area to be divided is also attempted. In the dividing method making use of this laser processing technique, the semiconductor wafer is divided by applying a pulse laser beam with a wavelength of 1,064 nm, for example, which is capable of passing through the wafer, with its focusing point set to the inside from the back surface of the semiconductor wafer to continuously form a deteriorated layer along the streets in the inside of the wafer and exerting external force along the streets whose strength has been reduced by the formation of the deteriorated layers. This method is disclosed by Japanese Patent No. 3408805, for example.

When the wafer is divided into individual chips by the above dividing method making use of the laser processing technique, the above-described method is also used to mount the adhesive film onto the back surfaces of the individual chips.

The technology disclosed by JP-A 2002-118081 requires the step of removing the portions exposed to the gaps between adjacent semiconductor chips of the adhesive film by chemical etching or the step of dividing the adhesive film by applying a laser beam after the adhesive film for die bonding is mounted on the back surface of the semiconductor wafer divided into individual semiconductor chips. Therefore, there is a problem in that the technology has low productivity.

SUMMARY OF THE INVENTION

It is an object of the present invention to provide an adhesive film dividing method and apparatus capable of dividing, efficiently and surely, an adhesive film for die bonding mounted on the back surface of a wafer having a plurality of streets formed on the front surface in a lattice pattern and function elements formed in a plurality of areas sectioned by the plurality of streets.

According to the present invention, firstly, the above object of the present invention can be attained by a method of dividing an adhesive film mounted on the back surface of a wafer having a plurality of streets formed on the front surface in a lattice pattern and function elements formed in a plurality of areas sectioned by the plurality of streets, along the streets in a state where the wafer is put on the surface of a protective tape mounted on an annular frame, wherein the adhesive film is cooled and the protective tape is expanded to divide the adhesive film along the outer peripheries of the function elements.

According to the present invention, secondly, the above object of the present invention can be attained by an apparatus for dividing an adhesive film mounted on the back surface of a wafer having a plurality of streets formed on the front surface in a lattice pattern and function elements formed in a plurality of areas sectioned by the plurality of streets, along the streets in a state where the wafer is put on the surface of a protective tape mounted on an annular frame, the apparatus comprising:

a frame holding means for holding the annular frame;

a tape expanding means for expanding the protective tape mounted on the annular frame held on the frame holding means; and a cooling means for cooling the adhesive film mounted on the back surface of the wafer supported to the annular frame held on the frame holding means through the protective tape.

The above cooling means comprises a cooling table which is in contact with an area, on which the adhesive film of the protective tape mounted on the annular frame held on the frame holding means is put, and supports the area. This cooling table consists of a cooling plate in contact with the protective tape and a thermoelectric cooling device mounted on the undersurface of the cooling plate.

The above cooling means is composed of a cooling fluid spray means for spraying a cooling fluid on the wafer put on the protective tape mounted on the annular frame held on the frame holding means through the adhesive film or on the protective tape.

According to the present invention, the adhesive film can be divided efficiently and surely since it is divided along the outer peripheries of the function elements by expanding the protective tape in a state where the adhesive film mounted on the back surface of the wafer supported to the annular frame held on the frame holding means through the protective tape is cooled to reduce its stretchability so as to exert tensile force to the adhesive film.

DETAILED DESCRIPTION OF THE PREFERRED EMBODIMENTS

Preferred embodiments of a method and apparatus for dividing the adhesive film put on the wafer constituted according to the present invention will be described in detail hereinbelow with reference to the accompanying drawings.

Figure 1:
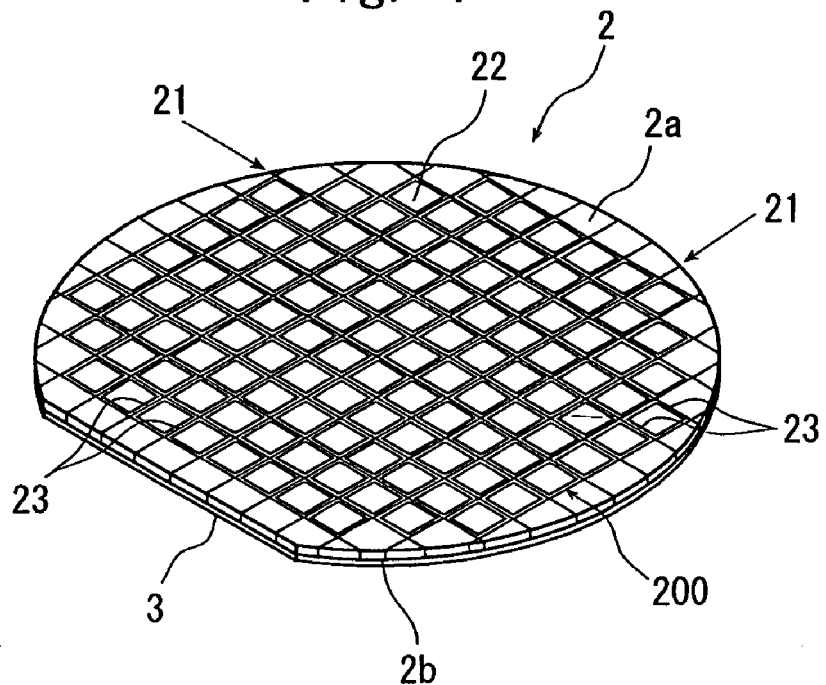
FIG. 1 is a perspective view showing a state where an adhesive film for die bonding is put on the back surface of a semiconductor wafer divided into individual semiconductor chips by a pre-dicing technique.

FIG. 1 shows a state where an adhesive film 3 for die bonding is mounted on the back surface of a semiconductor wafer 2 divided into individual semiconductor chips by the pre-dicing technique. A plurality of streets 21 are formed in a lattice pattern on the front surface 2a of the semiconductor wafer 2 shown in FIG. 1 and circuits 22 (function elements) are formed in a plurality of areas sectioned by the plurality of streets 21. To divide the semiconductor wafer 2 into individual semiconductor chips by the pre-dicing technique, dividing grooves 23 having a predetermined depth (corresponding to the final thickness of each semiconductor chip) are first formed along the streets 21 formed on the front surface 2a of the semiconductor wafer 2 by using a cutting machine (dividing groove forming step). Then, a protective member is placed on the front surface 2a of the semiconductor wafer 2 having the dividing grooves 23 formed therein, and the back surface 2b of the semiconductor wafer 2 is ground to expose the dividing grooves 23 to the back surface 2b so as to divide the semiconductor wafer 2 into individual semiconductor chips 200 (dividing groove exposing step). The adhesive film 3 for die bonding is mounted on the back surface 2b of the semiconductor wafer 2 divided into individual semiconductor chips. At this point, the adhesive film 3 is pressed against the back surface 2b of the semiconductor wafer 2 while it is heated at a temperature of 80 to 200° C. to be mounted on the back surface 2b.

Figure 2:
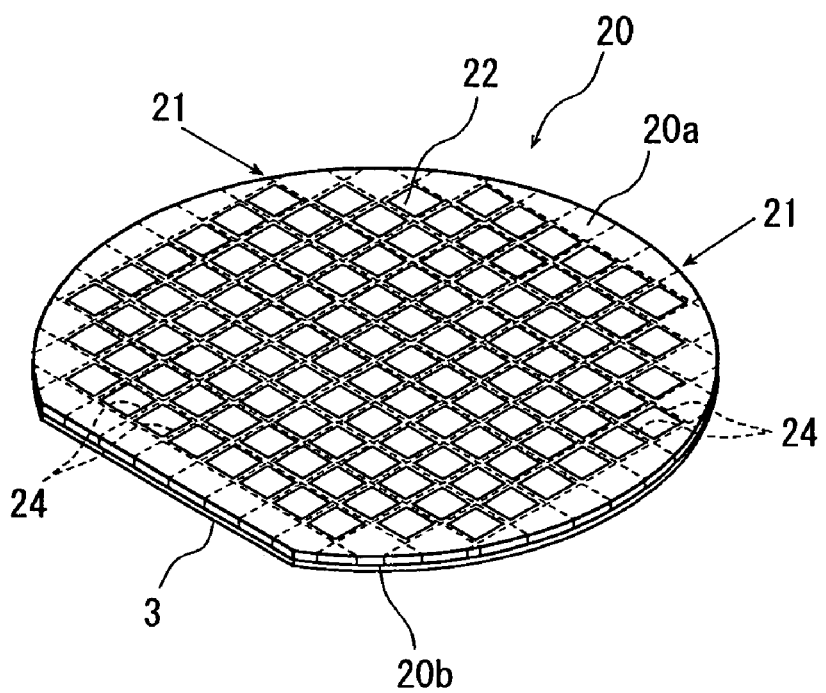
FIG. 2 is a perspective view showing a state where an adhesive film for die bonding is put on the back surface of a semiconductor wafer having a deteriorated layer formed along streets by laser processing.

FIG. 2 shows a state where the adhesive film 3 for die bonding is mounted on the back surface of a semiconductor wafer 20 having a deteriorated layer formed therein along streets by laser processing. Like the semiconductor wafer 2 shown in FIG. 1, a plurality of streets 21 are formed in a lattice pattern on the front surface 20a of the semiconductor wafer 20 shown in FIG. 2 and circuits 22 (function elements) are formed in a plurality of areas sectioned by the plurality of streets 21. The deteriorated layer 24 is continuously formed along the streets 21 in the inside of the thus formed semiconductor wafer 20 by applying a pulse laser beam having a wavelength of 1,064 nm, which is capable of passing through the wafer, from the back surface 20b along the streets 21 with its focusing point set to the inside. The adhesive film 3 for die bonding is mounted on the back surface 20b of the semiconductor wafer 20 having the deteriorated layer 24 formed thus along the streets 21. At this point, the adhesive film 3 is pressed against the back surface 20b of the semiconductor wafer 20 while it is heated at a temperature of 80 to 200° C. to be mounted on the back surface 20b.

Figure 3:
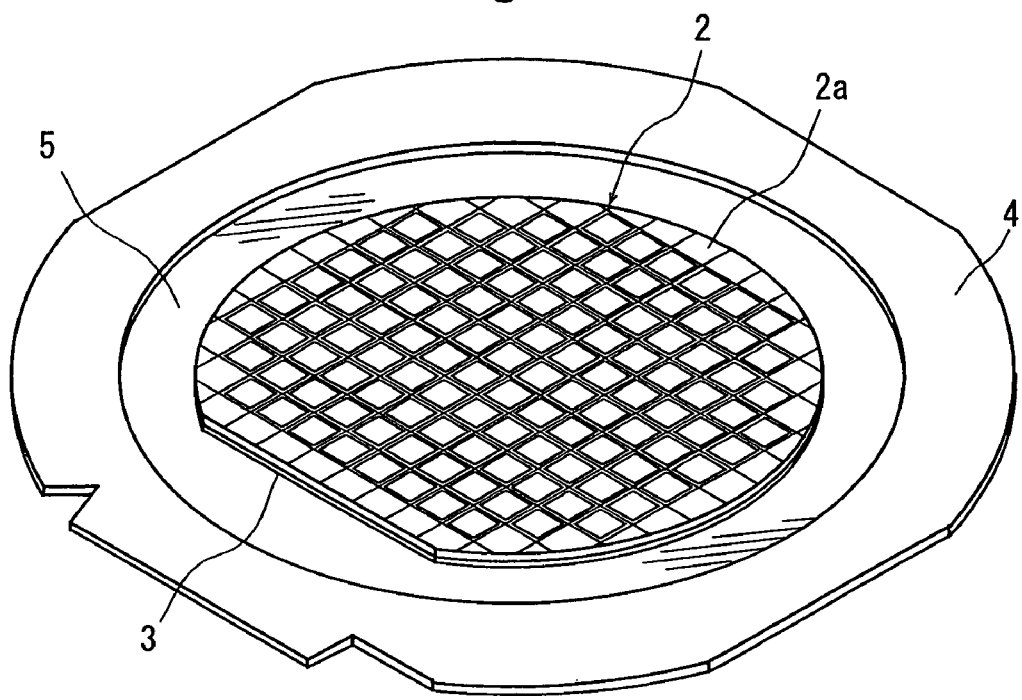
FIG. 3 is a perspective view showing a state where the semiconductor wafer shown in FIG. 1 is put on the surface of a protective tape mounted on an annular frame.
Figure 4:
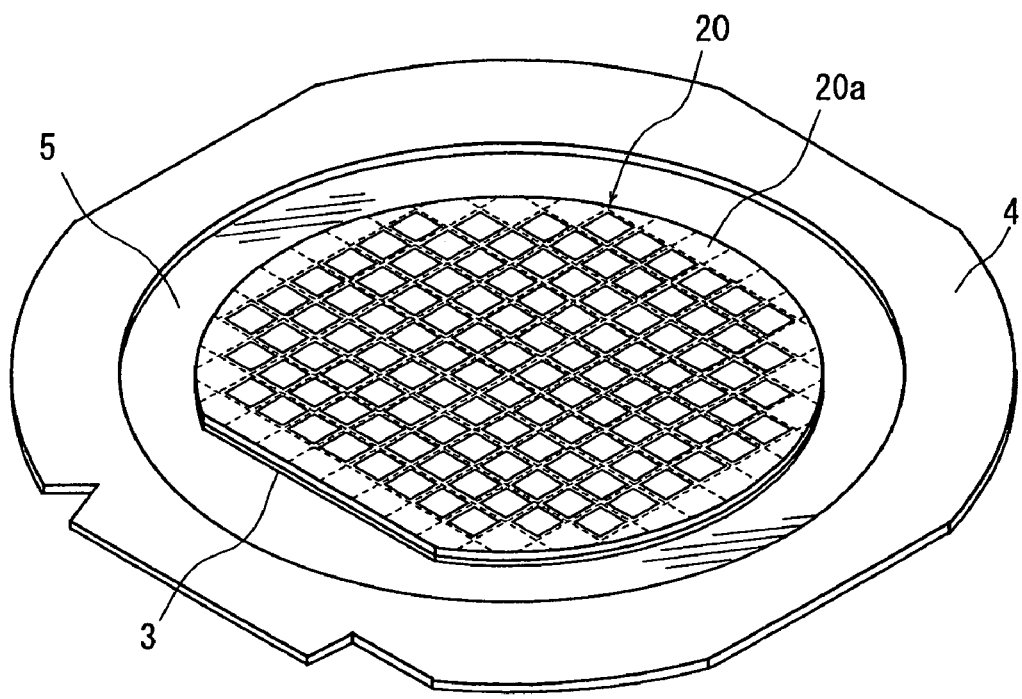
FIG. 4 is a perspective view showing a state where the semiconductor wafer shown in FIG. 2 is put on the surface of the protective tape mounted on the annular frame.

To divide the above adhesive film 3 for die bonding mounted on the back surface of the semiconductor wafer 2 or the above adhesive film 3 for die bonding mounted on the back surface of the semiconductor wafer 20 along the streets 21, the adhesive film 3 side of the semiconductor wafer 2 or the adhesive film 3 side of the semiconductor wafer 20 is put on the surface of a protective tape 5 whose peripheral portion is mounted on an annular frame 4 so as to cover its inner opening as shown in FIG. 3 or FIG. 4. The above protective tape 5 is a polyolefin sheet having a thickness of 95 µm in the illustrated embodiment. This protective tape 5 is made of an elastic material.

A description will be subsequently given of an embodiment of an apparatus for dividing the adhesive film 3 mounted on the back surface of the semiconductor wafer 2 or the adhesive film 3 mounted on the back surface of the semiconductor wafer 20, which is supported to the annular frame 4 through the protective tape 5 as described above, along the streets 21, with reference to FIG. 5 and FIG. 6.

Figure 5:
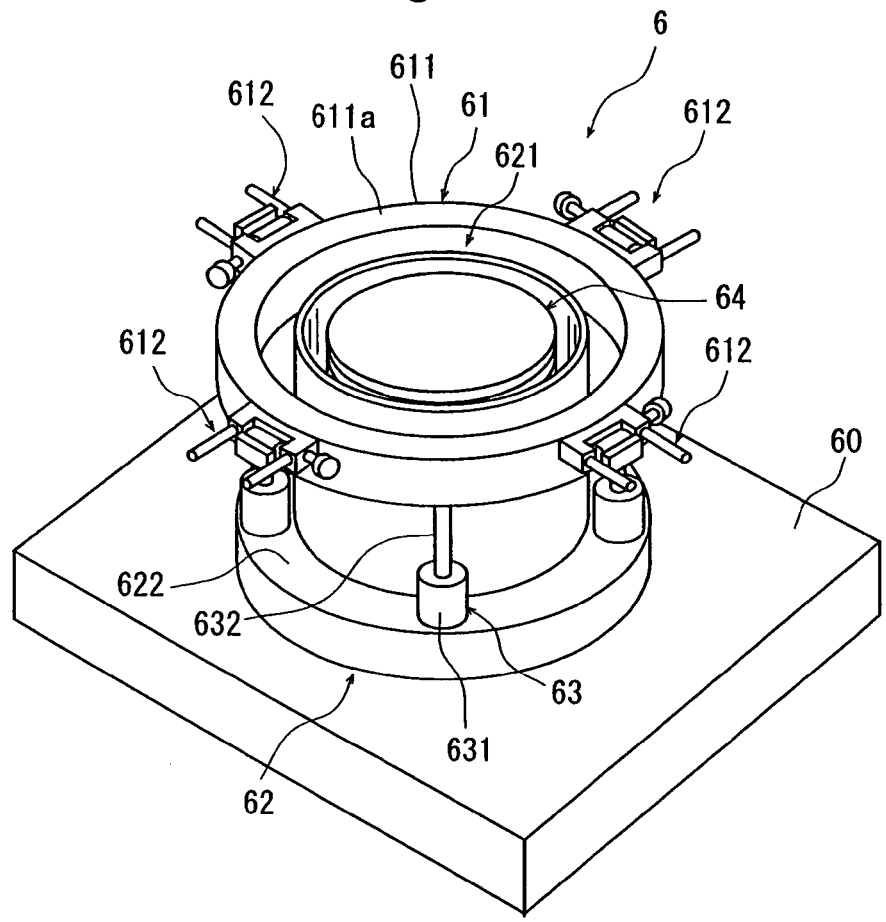
FIG. 5 is a perspective view of an apparatus for dividing the adhesive film mounted on the wafer constituted according to an embodiment of the present invention.
Figure 6:
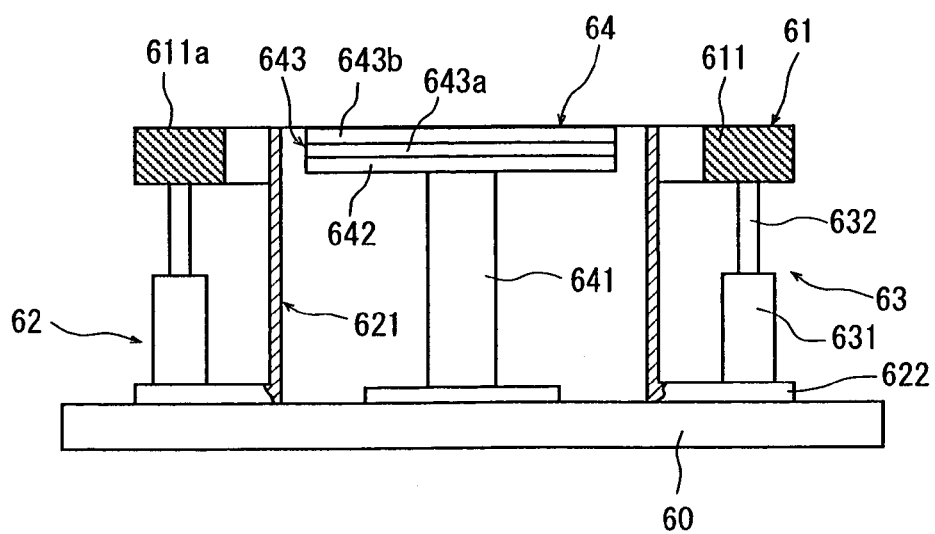
FIG. 6 is a front view showing, in a partial cutaway manner, the apparatus for dividing the adhesive film shown in FIG. 5.

The apparatus 6 for dividing the adhesive film shown in FIG. 5 and FIG. 6 has a base 60, a frame holding means 61 that is arranged above the base 60 and holds the above annular frame 4, and a tape expanding means 62 for expanding the protective tape 5 mounted on the annular frame 4 supported on the frame holding means 61. The frame holding means 61 comprises an annular frame holding member 611 and four clamps 612 as a fixing means arranged on the periphery of the frame holding member 611. The top surface of the frame holding member 611 serves as a placing surface 611a for placing the annular frame 4, and the annular frame 4 is placed on this placing surface 611a. The annular frame 4 placed on the placing surface 611a is fixed on the frame holding member 611 by the clamps 612. The frame holding means 61 thus constituted is supported by the tape expanding means 62 in such a manner that it can move in the up-and-down direction.

The tape expanding means 62 comprises an expansion drum 621 arranged above the base 60 within the above annular frame holding member 611. This expansion drum 621 has a smaller inner diameter than the inner diameter of the annular frame 4 and a larger outer diameter than the outer diameter of the semiconductor wafer 2 or 20 put on the protective tape 5 mounted on the annular frame 4. As shown in FIG. 6, a mounting flange 622 is installed at the lower end of the expansion drum 621 and fixed on the base 60 by a fixing means such as fastening bolts. The tape expanding means 62 in the illustrated embodiment has support means 63 that can move the above annular frame holding member 611 in the up-and-down direction (axial direction). This support means 63 comprises a plurality of air cylinders 631 installed on the above support flange 622, and their piston rods 632 are connected to the undersurface of the above annular frame holding member 611. The support means 63 thus comprising the plurality of air cylinders 631 moves the annular frame holding member 611 in the up-and-down direction between a standard position where the placing surface 611a becomes substantially the same in height as the upper end of the expansion drum 621 and an expansion position where the placing surface 611a is positioned below the upper end of the expansion drum 621 by a predetermined distance. Therefore, the support means 63 comprising the plurality of air cylinders 631 functions as an expanding and moving means for moving the frame holding member 611 and the expansion drum 621 relative to each other in the up-and-down direction (axial direction).

The apparatus 6 for dividing the adhesive film in the illustrated embodiment has a cooling means 64 for cooling the adhesive film 3 mounted on the back surface of the semiconductor wafer 2 or 20 supported to the annular frame 4 held on the frame holding means 61 through the protective tape 5. The cooling means 64 comprises a support pole 641 installed upright on the top surface of the base 60 within the above expansion drum 621, around support plate 642 mounted on the upper end of the support pole 641, and a round cooling table 643 arranged on the top surface of the support plate 642. This cooling table 643 consists of around thermoelectric cooling device 643a arranged on the top surface of the support plate 642 and a round cooling plate 643b mounted on the top surface of the thermoelectric cooling device 643a. The thermoelectric cooling device 643a is connected to an electric circuit that is not shown. This cooling plate 643b constituting this cooling table 643 has substantially the same diameter as the diameter of the semiconductor wafer 2 or 20, that is, the diameter of the adhesive film, and its top surface is at the same height or slightly above the upper end of the above expansion drum 621. When a current is applied to the thermoelectric cooling device 643a of the thus constituted cooling means 64 through the electric circuit that is not shown, the cooling plate 643b is cooled by the Peltier effect of the thermoelectric cooling device 643a. In the illustrated embodiment, the thermoelectric cooling device 643a is used for cooling as the cooling table 643 constituting the above cooling means 64. A cooling table in which a cooling fluid is circulated may be used.

The apparatus 6 for dividing the adhesive film shown in FIG. 5 and FIG. 6 is constituted as described above. By using this apparatus 6 for dividing the adhesive film, the step of dividing the adhesive film 3 mounted on the back surface of the semiconductor wafer 2 supported to the above annular frame 4 through the protective tape 5, along the streets 21 (dividing grooves 23) will be described with reference to FIGS. 7(a) and 7(b).

Figure 7:
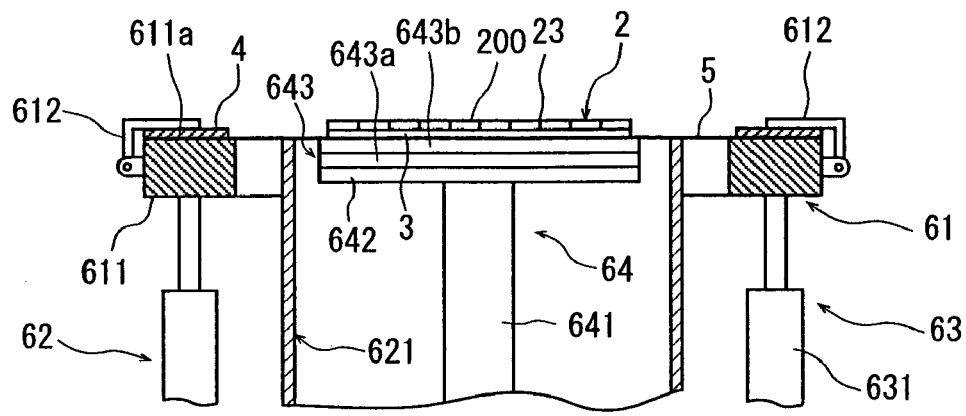
FIGS. 7(a) and 7(b) are explanatory diagrams showing the step of dividing the adhesive film put on the back surface of the semiconductor wafer shown in FIG. 1 with the apparatus for dividing the adhesive film shown in FIG. 5.
Figure 7:
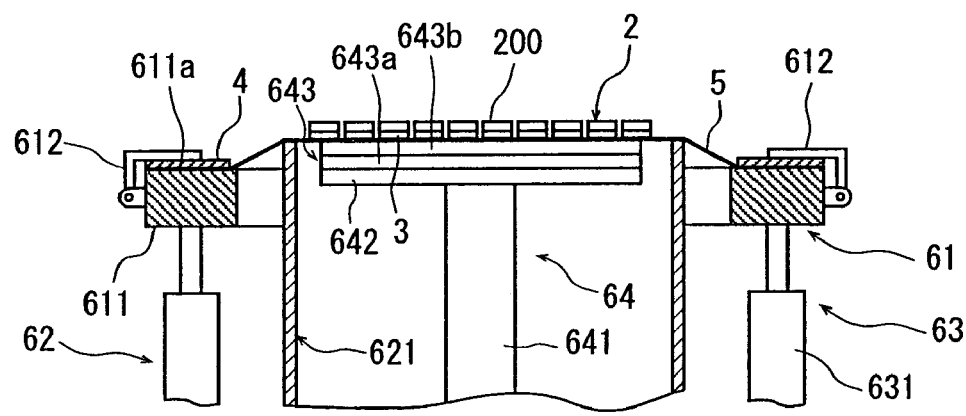

The annular frame 4 supporting the semiconductor wafer 2 having the adhesive film 3 on the back surface through the protective tape 5 as shown in FIG. 3 is placed on the placing surface 611a of the frame holding member 611 constituting the frame holding means 61 and fixed on the frame holding member 611 by the clamps 612, as shown in FIG. 7(a) (frame holding step). At this point, the frame holding member 611 is situated at the standard position shown in FIG. 7(a). In this state, the area, on which the adhesive film 3 of the protective tape 5 mounted on the annular frame 4 is put is in contact with, and supported on, the top surface of the cooling plate 643b constituting the cooling table 643 of the above cooling means 64. A current is applied to the thermoelectric cooling device 643a constituting the cooling table 643 through the electric circuit that is not shown. Therefore, as the cooling plate 643b is cooled by the Peltier effect of the thermoelectric cooling device 643a, the adhesive film 3 is cooled to 10° C. or lower by the cooling plate 643b.

Figure 8:
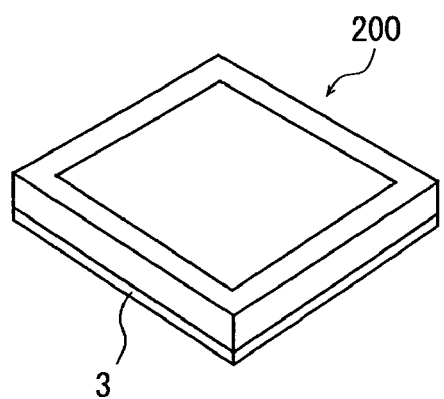
FIG. 8 is a perspective view of a semiconductor chip having the adhesive film divided in the adhesive film dividing step shown in FIGS. 7(a) and 7(b), put on the back surface.

Thereafter, the annular frame holding member 611 is lowered to the expansion position shown in FIG. 7(b) by activating the plurality of air cylinders 631 as the support means 63 constituting the tape expanding means 62. Therefore, the annular frame 4 fixed on the placing surface 611a of the frame holding member 611 is also lowered, whereby the protective tape 5 mounted on the annular frame 4 comes into contact with the upper edge of the expansion drum 621 to be expanded as shown in FIG. 7(b) (tape expansion step). As a result, tensile force acts radially on the adhesive film 3 mounted on the back surface of the semiconductor wafer 2 put on the protective tape 5. When tensile force thus acts radially on the adhesive film 3 mounted on the back surface of the semiconductor wafer 2, the semiconductor wafer 2 is divided into individual semiconductor chips 200 along the streets 21 (dividing grooves 23), whereby the intervals between adjacent semiconductor chips 200 are expanded and the adhesive film 3 is easily divided along the streets 21 (dividing grooves 23). At this point, the adhesive film 3 is sticky at normal temperature and expands when the above tensile force is applied thereto, thereby making it difficult to divide it without fail. Therefore, the adhesive film 3 is cooled to 10° C. or lower by the cooling means 64 to reduce its stretchability in the illustrated embodiment, thereby making it possible to divide it along the streets 21 (dividing grooves 23) without fail. That is, the adhesive film 3 is divided along the peripheries of individual semiconductor chips 200 (function elements) without fail. Although the semiconductor wafer 2 is divided into individual semiconductor chips 200, as the semiconductor wafer 2 is put on the protective tape 5 through the divided adhesive film 3, the semiconductor chips 200 do not fall apart and the form of the wafer is maintained. After the adhesive film 3 mounted on the back surface of the semiconductor wafer 2 is divided along the streets 21 (dividing grooves 23) as described above, the semiconductor chips are peeled off from the protective tape 5 in the pick-up step so that the semiconductor chips 200 having the adhesive film 3 on the back surface as shown in FIG. 8 can be picked up.

A description will be subsequently given of the step of dividing the adhesive film 3 mounted on the back surface of the semiconductor wafer 20 supported to the above annular frame 4 through the protective tape 5, along the streets 21 (deteriorated layers 24) by using the apparatus 6 for dividing the adhesive film shown in FIG. 5 and FIG. 6, with reference to FIGS. 9(a) and 9(b).

Figure 9:
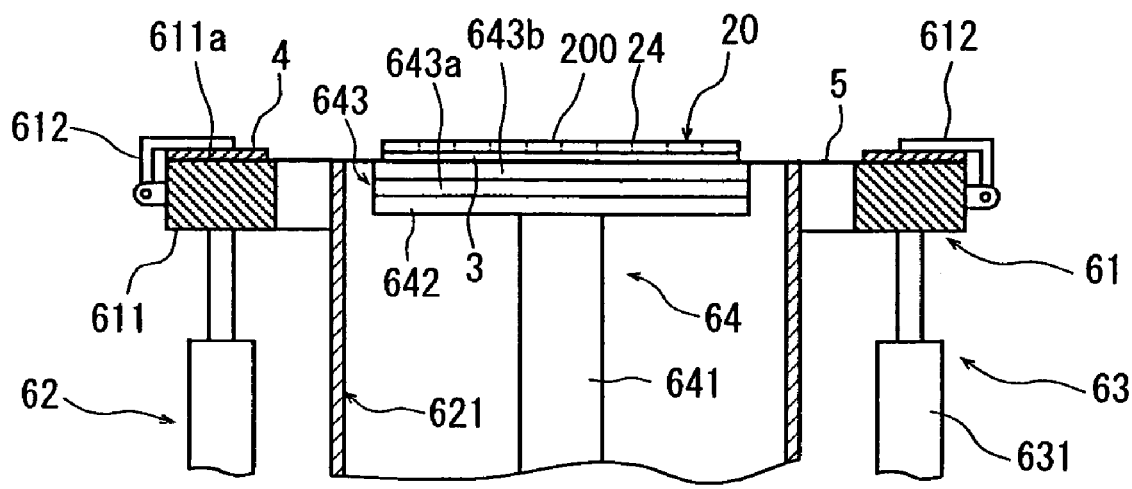
FIGS. 9(a) and 9(b) are explanatory diagrams showing the step of dividing the adhesive film put on the back surface of the semiconductor wafer shown in FIG. 2 with the apparatus for dividing the adhesive film shown in FIG. 5.
Figure 9:
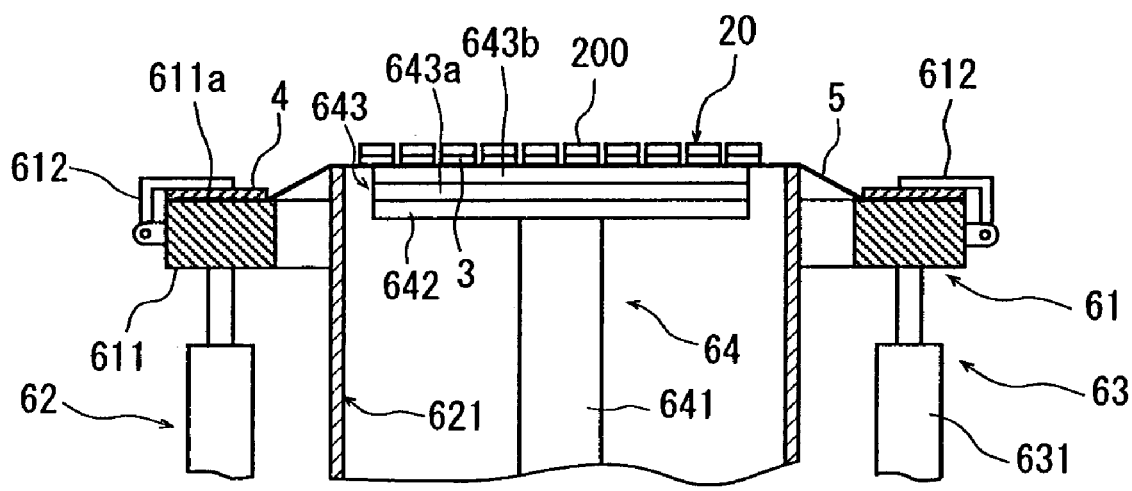

The adhesive film dividing step shown in FIGS. 9(a) and 9(b) includes the frame holding step shown in FIG. 9(a) and the tape expanding step shown in FIG. 9(b), like the adhesive film dividing step shown in FIGS. 7(a) and 7(b). When tensile force is applied radially to the adhesive film 3 mounted on the back surface of the semiconductor wafer 20 put on the protective tape 5 in this tape expansion step, tensile force acts also radially on the semiconductor wafer 20. As a result, the semiconductor wafer 20 is divided into individuals semiconductor chips 200 along the deteriorated layers 24 as the deteriorated layers 24 formed along the streets 21 of the semiconductor wafer 20 have reduced strength. The adhesive film 3 mounted on the back surface of the semiconductor wafer 20 is also divided along the deteriorated layers 24 at the same time when the semiconductor wafer 20 is divided along the deteriorated layers 24. Since the adhesive film 3 is cooled to 10° C. or lower by the cooling means 64 to reduce its stretchability as described above at this point, it can be divided along the deteriorated layers 24 without fail. After the adhesive film 3 mounted on the back surface of the semiconductor wafer 20 is divided along the deteriorated layers 24, the semiconductor chips are peeled off from the protective tape 5 in the pick-up step, whereby the semiconductor chips 200 having the adhesive film 3 on the back surface as shown in FIG. 8 can be picked up.

The apparatus for dividing the adhesive film according to another embodiment of the present invention will be described with reference to FIG. 10.

Figure 10:
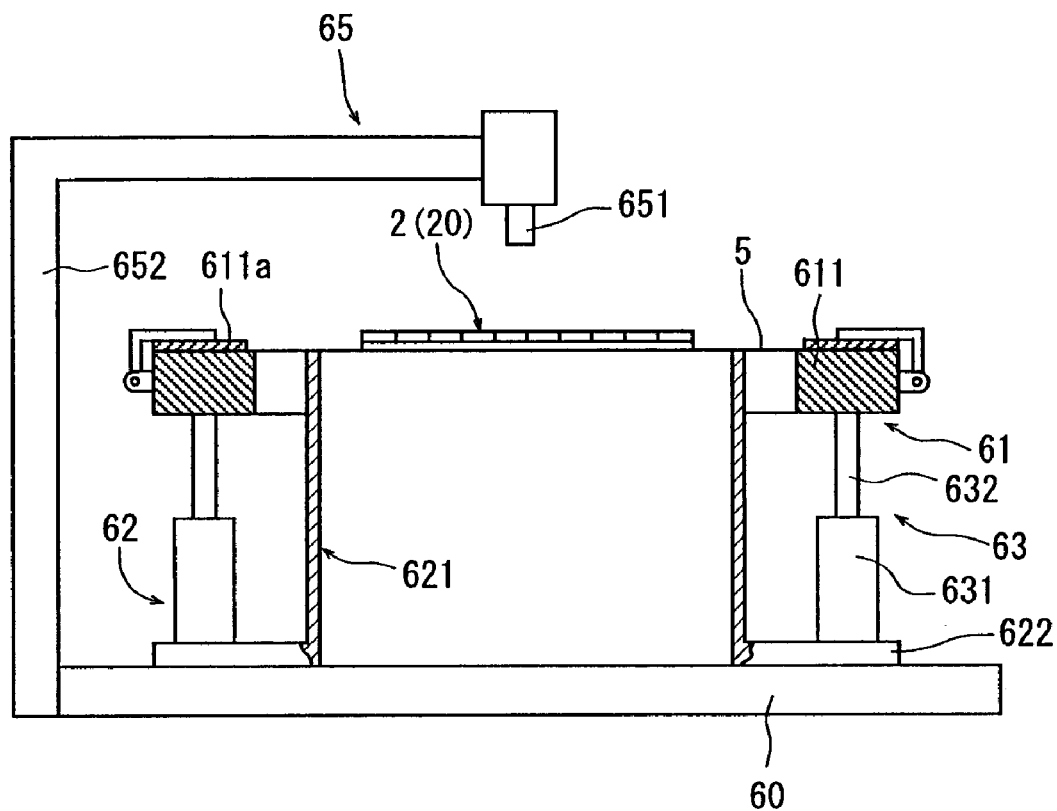
FIG. 10 is a front view showing, in a partial cutaway manner, an apparatus for dividing the adhesive film put on the wafer constituted according to another embodiment of the present invention.

The apparatus 6 for dividing the adhesive film shown in FIG. 10 is substantially the same as the apparatus 6 for dividing the adhesive film shown in FIG. 5 and FIG. 6 except for the constitution and the cooling means. Therefore, in the apparatus 6 for dividing the adhesive film shown in FIG. 10, the same members as the constituent members of the above-described apparatus 6 for dividing the adhesive film shown in FIG. 5 and FIG. 6 are given the same reference symbols and their descriptions are omitted.

The cooling means provided in the apparatus 6 for dividing the adhesive film shown in FIG. 10 is composed of a cooling fluid spray means 65 for spraying a cooling fluid on the semiconductor wafer 2 put on the protective tape 5 mounted on the annular frame 4 supported on the frame holding means 61 through the adhesive film 3. This cooling fluid spray means 65 comprises a cooling fluid spray nozzle 651 arranged above the expansion drum 621 and a support member 652 for supporting the cooling fluid spray nozzle 651 to the base 60. The cooling fluid spray nozzle 651 is communicated with a cooling fluid supply means that is not shown. The thus constituted cooling fluid spray means 65 sprays a cooling fluid (air) having a temperature of 10° C. or lower onto the semiconductor wafer 2 or 20 supported to the annular frame 4 held on the frame holding means 61 through the protective tape 5 from the cooling fluid spray nozzle 651 by activating a cooling fluid supply means that is not shown. As a result, the semiconductor wafer 2 or 20 is cooled, whereby the adhesive film 3 mounted on the back surface of the semiconductor wafer 2 or 20 is cooled.

Figure 11:
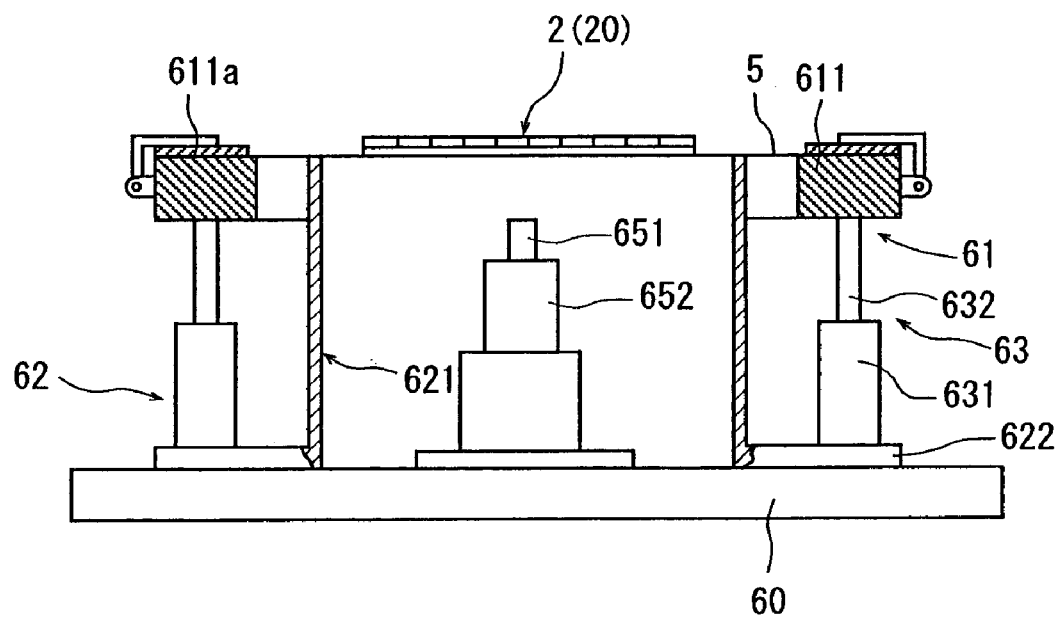
FIG. 11 is a front view showing, in a partial cutaway manner, an apparatus for dividing the adhesive film put on the wafer constituted according to still another embodiment of the present invention.

The apparatus 6 for dividing the adhesive film according to still another embodiment of the present invention will be described with reference to FIG. 11. In the apparatus 6 for dividing the adhesive film shown in FIG. 11, the cooling fluid spray means 65 of the apparatus 6 shown in FIG. 10 is arranged within the expansion drum 621. That is, the cooling fluid spray nozzle 651 mounted on the upper end of the support member 652 installed on the base 60 is opposed to the area, on which the adhesive film 3 of the protective tape 5 mounted on the annular frame 4 held on the frame holding means 61 is put. The cooling fluid spray nozzle 651 is communicated with cooling fluid supply means that is not shown.

While the invention has been described as related to the embodiments shown in the accompanying drawings, it is to be understood that the invention is not limited thereto and that various changes and modifications may be made in the invention without departing from the spirit and scope thereof. For example, in the illustrated embodiments, the present invention is applied to a tape expansion apparatus having the constitution that the protective tape 5 mounted on the annular frame 4 is expanded by moving the frame holding means 61 and the expansion drum 621 relative to each other. The present invention, however, may be applied to a tape expansion apparatus in which an area is interposed between the inner periphery of the annular frame 4 and the semiconductor wafer 2 in the protective tape 5 mounted on the annular frame 4 held on the frame holding means 61 and the protective tape 5 is expanded outward in the radial direction.

What is claimed is:

1. An apparatus for dividing an adhesive film mounted on the back surface of a wafer, along a plurality of streets formed on the wafer front surface in a lattice pattern with function elements formed in a plurality of areas sectioned by the plurality of streets, the wafer with the adhesive film being on a surface of a protective tape mounted on an annular frame, the apparatus comprising:

a frame holding means for holding the annular frame with the protective tape mounted thereon;

a cooling means for cooling the adhesive film through the protective tape to thereby reduce stretchability of the film; and a tape expanding means for expanding the protective tape mounted on the annular frame and thereby divide the cooled adhesive film having reduced stretchability so as to separate the adhesive film into individual pieces corresponding to the function elements.

2. The apparatus for dividing an adhesive film according to claim 1, wherein the cooling means comprises a cooling table which is in contact with an area, on which the adhesive film of the protective tape put on the annular frame held on the frame holding means is mounted, and supports the area.

3. The apparatus for dividing an adhesive film according to claim 2, wherein the cooling table consists of a cooling plate in contact with the protective tape and a thermoelectric cooling device mounted on the undersurface of the cooling plate.

4. The apparatus for dividing an adhesive film according to claim 1, wherein the cooling means is composed of a cooling fluid spray means for spraying a cooling fluid on the wafer put on the protective tape mounted on the annular frame held on the frame holding means through the adhesive film or on the protective tape.

* * * * *